(12) United States Patent
Chang et al.

(10) Patent No.: US 11,646,301 B2
(45) Date of Patent: May 9, 2023

(54) DISPLAY DEVICE

(71) Applicant: Au Optronics Corporation, Hsinchu (TW)

(72) Inventors: Chi-Ho Chang, Hsinchu (TW); Yang-En Wu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/511,600

(22) Filed: Oct. 27, 2021

(65) Prior Publication Data

US 2023/0005894 A1 Jan. 5, 2023

(30) Foreign Application Priority Data

Jul. 5, 2021 (TW) ................................. 110124649

(51) Int. Cl.
*H01L 25/16* (2023.01)
*G06F 3/041* (2006.01)
*H05K 1/18* (2006.01)
*H05K 1/02* (2006.01)

(52) U.S. Cl.
CPC ............ *H01L 25/167* (2013.01); *G06F 3/041* (2013.01); *H05K 1/181* (2013.01); *H01L 25/162* (2013.01); *H05K 1/0274* (2013.01); *H05K 2201/1053* (2013.01); *H05K 2201/10106* (2013.01); *H05K 2201/10492* (2013.01); *H05K 2201/10515* (2013.01)

(58) Field of Classification Search
CPC ..... H01L 25/167; H01L 25/162; G06F 3/041; H05K 1/181; H05K 1/0274; H05K 2201/10106; H05K 2201/10492; H05K 2201/10515; H05K 2201/1053
See application file for complete search history.

(56) References Cited

U.S. PATENT DOCUMENTS

| 10,468,394 | B1 | 11/2019 | Xi et al. | |
|---|---|---|---|---|
| 10,868,209 | B2* | 12/2020 | Lim | H01L 25/167 |
| 11,013,111 | B2* | 5/2021 | Tsai | H01L 33/62 |
| 11,133,423 | B2* | 9/2021 | Tsai | H01L 31/02002 |
| 11,393,965 | B2* | 7/2022 | Nakabayashi | H05K 3/284 |
| 11,469,277 | B2* | 10/2022 | Chung | H10K 59/65 |
| 11,476,239 | B2* | 10/2022 | Higginson | H01L 33/06 |
| 11,487,372 | B2* | 11/2022 | Huang | G02F 1/133305 |
| 11,495,149 | B2* | 11/2022 | Tseng | G09F 9/3026 |
| 11,527,194 | B2* | 12/2022 | Kao | H01L 33/62 |
| 2019/0373723 | A1* | 12/2019 | Tsai | H05K 1/11 |

(Continued)

FOREIGN PATENT DOCUMENTS

| CN | 109273436 | 5/2020 |
|---|---|---|
| TW | 201933603 | 8/2019 |
| TW | I679627 | 12/2019 |

*Primary Examiner* — Vinh T Lam
(74) *Attorney, Agent, or Firm* — JCIPRNET

(57) ABSTRACT

A display device includes a circuit board and a plurality of light-emitting units disposed on the circuit board. The circuit board includes a substrate and a plurality of signal lines disposed on the substrate. Each light-emitting unit includes a base board, at least one light-emitting element and a driving circuit layer. The light-emitting element is between the base board and the substrate. The driving circuit layer is between the light-emitting element and the base board, and electrically connected to the light-emitting element and the signal line.

17 Claims, 8 Drawing Sheets

(56) References Cited

U.S. PATENT DOCUMENTS

| | | | |
|---|---|---|---|
| 2020/0043906 A1 | 2/2020 | Kuo et al. | |
| 2021/0005761 A1* | 1/2021 | Tsai | H01L 25/165 |
| 2022/0013509 A1* | 1/2022 | Lee | H01L 27/124 |
| 2022/0093578 A1* | 3/2022 | Lin | H01L 25/162 |
| 2022/0286653 A1* | 9/2022 | Liu | G03B 21/208 |

* cited by examiner

DISPLAY DEVICE

CROSS-REFERENCE TO RELATED APPLICATION

This application claims the priority benefit of Taiwan application serial no. 110124649, filed on Jul. 5, 2021. The entirety of the above-mentioned patent application is hereby incorporated by reference herein and made a part of this specification.

BACKGROUND

Technical Field

The disclosure relates to a display device, and more particularly to a miniature light-emitting diode display device.

Description of Related Art

For display products, it is a trend to design the display product with a narrow border, which can maximize the visual range of the screen at the same resolution, and can reduce the visual interference of the border when the screen is stitched into a large-size panel.

In order to realize the design of narrow border, the current practice is to arrange the driver chip on the rear side of the substrate, and the trace passing through the lateral side of the substrate is utilized to connect the driver circuit on the front side of the substrate and the driver chip on the rear side of the substrate. However, the trace on the lateral side can be damaged easily, resulting in low yield rate.

In addition, displays with different specifications (for example, resolution) have different driver circuit configurations, which makes it impossible to share photomasks and production costs cannot be reduced.

SUMMARY

The disclosure provides a display device with improved yield rate and reduced production cost.

An embodiment of the disclosure provides a display device, including a circuit board which includes a substrate and a plurality of signal lines disposed on the substrate; and a plurality of light-emitting units disposed on the circuit board. Each light-emitting unit includes a base board; at least one light-emitting element located between the base board and the substrate; and a driving circuit layer located between the light-emitting element and the base board, and electrically connected to the light-emitting element and the signal line.

In an embodiment of the disclosure, an orthographic projection region of the light-emitting unit on the substrate includes an opening region and a trace region, and the signal line is located in the trace region.

In an embodiment of the disclosure, the orthographic projection of the light-emitting element on the substrate is located in the opening region.

In an embodiment of the disclosure, the circuit board further includes an active element, and the active element is located outside the orthographic projection region.

In an embodiment of the disclosure, the signal lines are parallel to each other and belong to the same layer.

In an embodiment of the disclosure, the driving circuit layer includes a transistor, and the transistor is electrically connected to the signal line.

In an embodiment of the disclosure, the signal lines include scan lines and data lines.

In an embodiment of the disclosure, the circuit board further includes an auxiliary line, and an extending direction of the auxiliary line is different from the extending direction of the scan line.

In an embodiment of the disclosure, the light-emitting surface of the light-emitting element faces the substrate or base board.

In an embodiment of the disclosure, the signal line includes a power line, and the power line is electrically connected to the light-emitting element.

In an embodiment of the disclosure, the driving circuit layer has a recess, and the light-emitting element is located in the recess.

In an embodiment of the disclosure, the display device further includes a color conversion layer, and the color conversion layer is located between the substrate and the light-emitting element.

In an embodiment of the disclosure, the circuit board further includes a touch sensing layer, and the touch sensing layer is located between the substrate and the signal line.

In an embodiment of the disclosure, the signal line further includes a touch transmission line, and the touch transmission line is electrically connected to the touch sensing layer.

In an embodiment of the disclosure, the circuit board further includes a photosensitive element, and the photosensitive element is located between the substrate and the signal line.

In an embodiment of the disclosure, the signal lines belong to different layers.

In an embodiment of the disclosure, the display device further includes a driver chip located on one side of the base board opposite to the light-emitting element, and the driver chip is electrically connected to the signal line.

In order to make the above-mentioned features and advantages of the present disclosure more comprehensible, the following specific embodiments are described in detail in conjunction with the accompanying drawings.

DESCRIPTION OF THE EMBODIMENTS

Figure 1A:
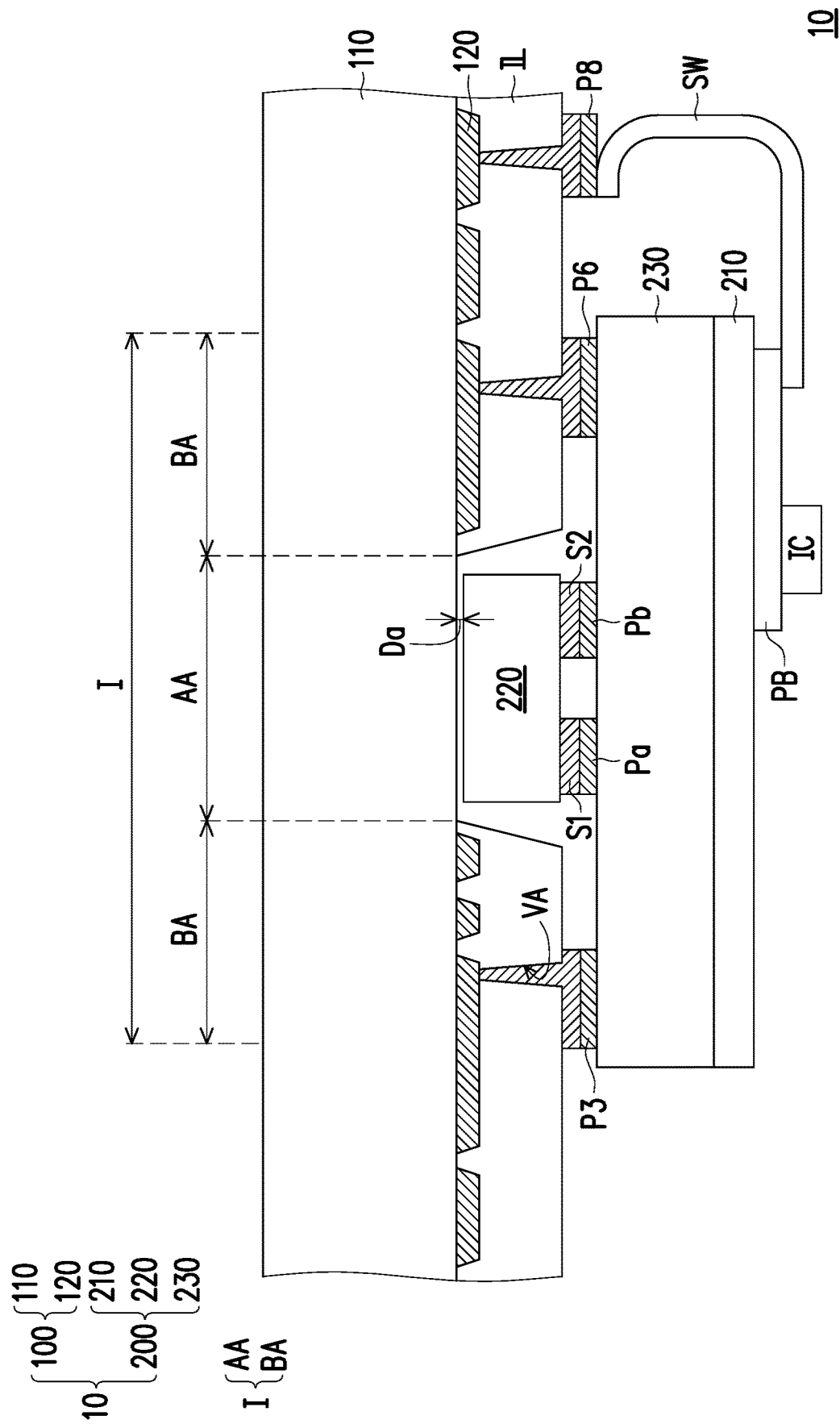
FIG. 1A is a schematic cross-sectional view of a display device 10 according to an embodiment of the disclosure.
Figure 1B:
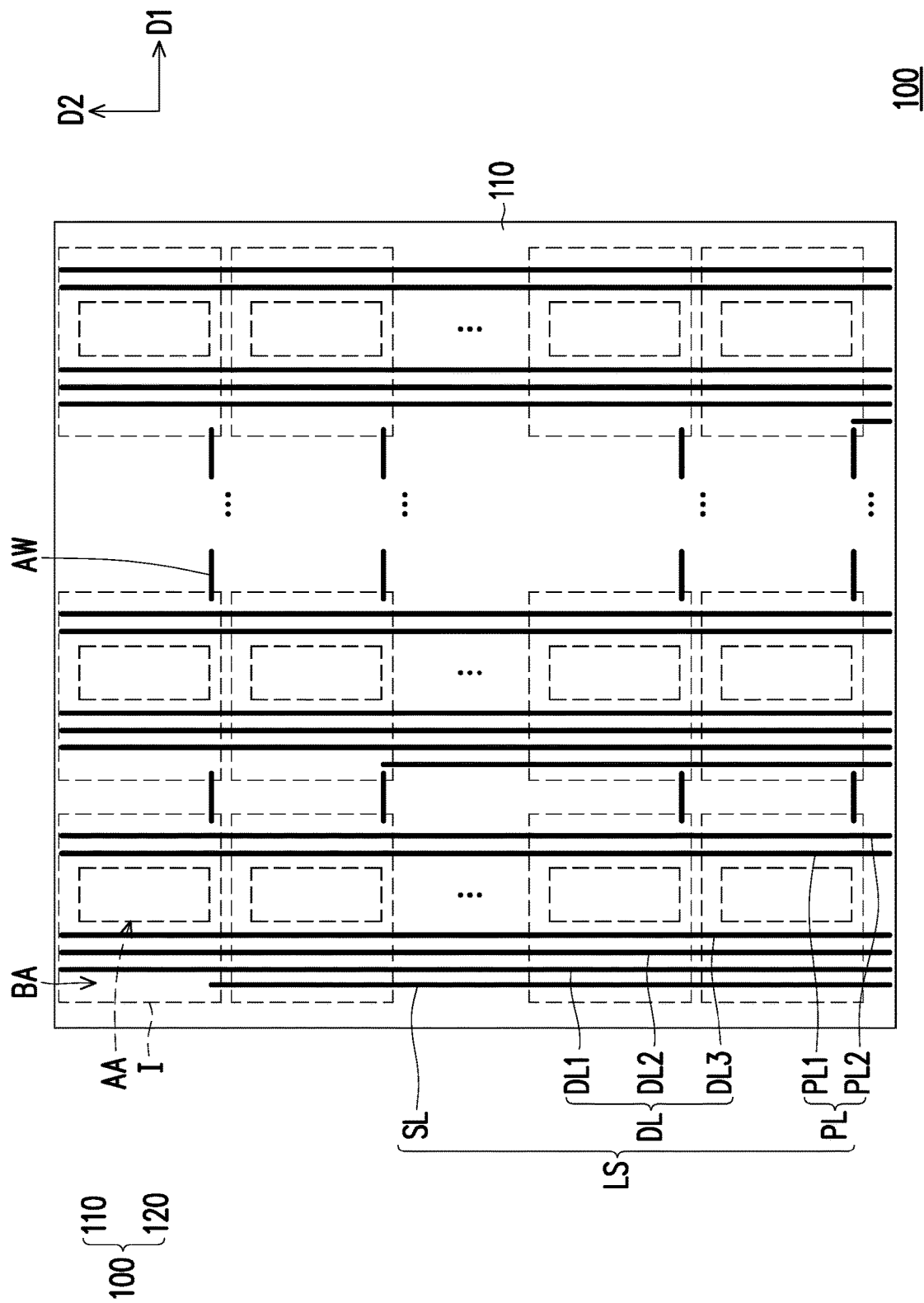
FIG. 1B is a schematic bottom view of a circuit board 100 of the display device 10 of FIG. 1A.
Figure 1C:
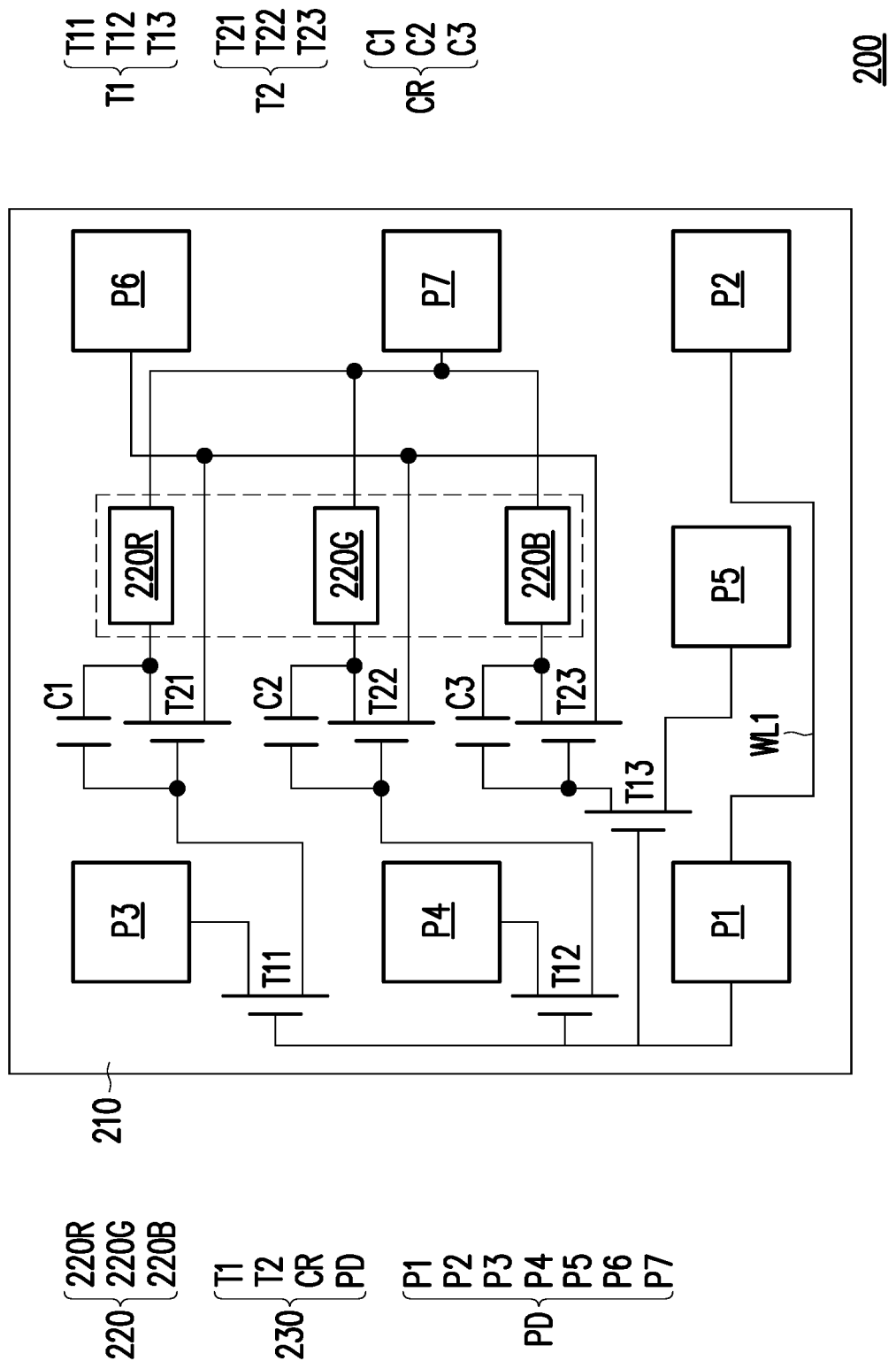
FIG. 1C is a schematic top view of a light-emitting unit 200 of the display device 10 of FIG. 1A.

FIG. 1A is a schematic cross-sectional view of a display device 10 according to an embodiment of the disclosure. FIG. 1B is a schematic bottom view of a circuit board 100 of the display device 10 of FIG. 1A. FIG. 1C is a schematic top view of a light-emitting unit 200 of the display device 10 of FIG. 1A.

Referring to FIG. 1A to FIG. 1C both, the display device 10 includes a circuit board 100 and a plurality of light-emitting units 200. The circuit board 100 includes a substrate 110 and a plurality of signal lines 120 on the substrate 110. The light-emitting unit 200 is located on the circuit board 100 and includes a base board 210, at least one light-emitting element 220 and a driving circuit layer 230. The light-emitting element 220 is located between the base board 210 and the substrate 110. The driving circuit layer 230 is located between the light-emitting element 220 and the base board 210 and is electrically connected to the light-emitting element 220 and the signal line 120.

In the display device 10 of an embodiment of the disclosure, by disposing the signal line 120 and the driving circuit layer 230 respectively on the circuit board 100 and the light-emitting unit 200 configured opposite to each other, it may not be required to use the trace passing through the lateral side of the substrate 100 to connect the driving circuit layer 230 and the driver chip IC, thus the low yield rate caused by the damage often caused to the trace on the lateral side can be avoided. In addition, the light-emitting element 220 and its driving circuit layer 230 are integrated into the light-emitting unit 200, so that the light-emitting unit 200 can be manufactured by using the same photomasks and can be matched with the circuit board 100 of different designs, so as to reduce the number of photomasks required to manufacture different products of the circuit board 100, thereby reducing the production costs.

Hereinafter, with reference to FIG. 1A to FIG. 1C, the implementation of each element of the display device 10 will be described, but the disclosure is not limited thereto.

First, referring to FIG. 1A and FIG. 1B both, the light-emitting unit 200 of the display device 10 may be arranged in an array on the circuit board 100, but the disclosure is not limited thereto. For example, in this embodiment, each light-emitting unit 200 may be correspondingly disposed in region I as shown in FIG. 1B. For example, region I may be an orthographic projection region of the light-emitting unit 200 on the substrate 110. The region I may include the opening region AA and the trace region BA. The opening region AA is not provided with any elements or traces, and the signal line 120 is located in the trace region BA, but the disclosure is not limited thereto. In some embodiments, the display device 10 may further include driving elements or signal lines arranged outside the region I. In some embodiments, the display device 10 may further include a light-shielding layer. The light-shielding layer may be located between the substrate 110 and the signal line 120 to prevent the signal line 120 from reflecting ambient light and affecting the display quality of the display device 10. Furthermore, an insulating layer can be arranged between the light-shielding layer and the signal line 120 to avoid unnecessary electrical connections.

For example, in this embodiment, the signal line 120 may include a scan line SL, a data line DL, and a power line PL. The scan line SL, the data line DL, and the power line PL may extend parallel to each other and belong to the same layer. In some embodiments, the signal line 120 may further include a trace such as a timing signal line, a detection signal line, a current compensation line, and so on. In some embodiments, the signal lines 120 may belong to two or more layers, and the signal lines 120 in any layer are parallel to each other, and the signal lines 120 in different layers can intersect each other or extend vertically. In this way, it is possible to avoid the short circuit caused by the interleaving signal lines 120 in the same layer. The material of the signal line 120 can be metal or alloy, such as gold, silver, copper, aluminum, titanium, molybdenum, or a combination thereof, but not limited thereto.

In this embodiment, the scan line SL, the data line DL, and the power line PL may be arranged along the first direction D1 and extend along the second direction D2, and the first direction D1 may intersect the second direction D2. In some embodiments, the first direction D1 may be perpendicular to the second direction D2. In addition, the circuit board 100 may further include an insulating layer IL, and the insulating layer IL may cover the signal line 120 to prevent the signal line 120 from being exposed and damaged. Furthermore, the insulating layer IL may have a plurality of through holes VA, and the through hole VA is provided with a through hole conductive structure penetrating the through hole VA, so that the signal line 120 can be connected.

For example, in this embodiment, the signal line 120 may include a plurality of circuit groups LS, and the plurality of circuit groups LS may be sequentially arranged along the first direction D1. Each circuit group LS may include one scan line SL, three data lines DL1, DL2, DL3, and two power lines PL1 and PL2 sequentially arranged along the first direction D1, but the disclosure is not limited thereto. In some embodiments, the arrangement order and number of the scan lines SL, the data lines DL, and the power lines PL can be changed according to actual requirements. In some embodiments, the circuit group LS may further include other traces.

The orthographic projection of the light-emitting element 220 of the light-emitting unit 200 on the substrate 110 may be located in the opening region AA to avoid affecting the light-emitting rate of the light-emitting element 220. The disclosure provides no specific limitation to the material of the substrate 110. In this embodiment, the light-emitting surface of the light-emitting element 220 may face the substrate 110, and the substrate 110 is preferably a transparent substrate, and its material may be glass, polymer or other suitable materials, but is not limited to thereto. In some embodiments, the substrate 110 may be an opaque substrate, and its material may be an epoxy resin-glass fiber composite material commonly used in printed circuit boards or other special resins (such as bismaleimide-triazine resin), and the substrate 110 may have openings corresponding to the opening region AA to facilitate the light-emitting element 220 to emit light.

Please refer to FIG. 1A and FIG. 1C both. In this embodiment, each light-emitting unit 200 may include three light-emitting elements 220, and the three light-emitting elements 220 may have different light colors. For example, the light-emitting unit 200 may include a red-color light-emitting element 220R, a green-color light-emitting element 220G, and a blue-color light-emitting element 220B, so that each light-emitting unit 200 can constitute one pixel of the display device 10, thereby realizing a full-color display effect. However, the disclosure provides no specific limitation to the number or light color of the light-emitting element 220. In some embodiments, each light-emitting unit 200 may include one, two, four, or more light-emitting elements 220.

The light-emitting element 220 is, for example, manufactured on a growth substrate, transferred to the base board 210 through a mass transfer process, and electrically connected to the driving circuit layer 230 through the pads Pa and Pb, respectively, and the anode and cathode of the light-emitting element 220 can be electrically connected to the pads Pa and Pb through the connecting materials S1 and S2, respectively. The connecting materials S1 and S2 are, for example, solder, conductive paste or other materials. In addition, other conductive materials or conductive paste may further be included between the connecting materials S1 and S2 and the pads Pa and Pb. In this embodiment, the light-emitting element 220 may be a horizontal miniature light-emitting diode, such as a flip chip type μ-LED, but the disclosure is not limited thereto. In other embodiments, the light-emitting element 220 may also be a vertical type μ-LED.

In this embodiment, since the light-emitting surface of the light-emitting element 220 faces away from the base board 210, the material of the base board 210 may include opaque/reflective materials (such as wafers, ceramics, etc.), or other applicable materials, but the disclosure is not limited thereto.

Each light-emitting unit 200 may include an independent driver circuit disposed on the driving circuit layer 230 thereof. For example, in this embodiment, the light-emitting unit 200 may adopt a dual transistor single capacitor (2T1C) active driver circuit, and the driving circuit layer 230 may include a select transistor T1, a driving transistor T2 and a storage capacitor CR corresponding to each light-emitting element 220. The select transistor T1 can control the pixel circuit of the light-emitting unit 200 to switch on or off. The driving transistor T2 is connected to a voltage source, and the select transistor T1 and driving transistor T2 can provide a stable current for the light-emitting element 220 within one frame time. Additionally, the storage capacitor CR can maintain the gate voltage of the driving transistor T2 after the scanning signal pulse of the pixel circuit ends, so as to provide a continuous driving current for the light-emitting element 220 until the end of one frame time. Therefore, the light-emitting units 200 can be tested separately first, and after confirming that the light-emitting units 200 can work normally, the qualified light-emitting units 200 can be assembled on the circuit board 100 to improve the yield rate. In some embodiments, the qualified light-emitting units 200, for example, can be transferred to the circuit board 100 through a mass transfer process, and the unqualified light-emitting units 200 can continue to be re-processed and tested or eliminated, for example.

In detail, in this embodiment, the driving circuit layer 230 may include a select transistor T11, a driving transistor T21, and a storage capacitor C1 provided corresponding to the light-emitting element 220R. The gate of the select transistor T11 can be electrically connected to the scan line SL; the source of the select transistor T11 can be electrically connected to the data line DL1; the drain of the select transistor T11 can be electrically connected to the gate of the driving transistor T21; the source of the driving transistor T21 can be electrically connected to the power line PL1; the drain of the driving transistor T21 can be electrically connected to the anode of the light-emitting element 220R; the cathode of the light-emitting element 220R can be electrically connected to the power line PL2; and the both ends of the storage capacitor C1 can be electrically connected to the drain of the select transistor T11 and the drain of the driving transistor T21.

The driving circuit layer 230 may further include a select transistor T12, a driving transistor T22, and a storage capacitor C2 provided corresponding to the light-emitting element 220G. The gate of the select transistor T12 can be electrically connected to the scan line SL; the source of the select transistor T12 can be electrically connected to the data line DL2; the drain of the select transistor T12 can be electrically connected to the gate of the driving transistor T22; the source of the driving transistor T22 can be electrically connected to the power line PL1; the drain of the driving transistor T22 can be electrically connected to the anode of the light-emitting element 220G; the cathode of the light-emitting element 220G can be electrically connected to the power line PL2; and both ends of the storage capacitor C2 can be electrically connected to the drain of the select transistor T12 and the drain of the driving transistor T22, respectively.

The driving circuit layer 230 may further include a select transistor T13, a driving transistor T23, and a storage capacitor C3 provided corresponding to the light-emitting element 220B. The gate of the select transistor T13 can be electrically connected to the scan line SL; the source of the select transistor T13 can be electrically connected to the data line DL3; the drain of the select transistor T13 can be electrically connected to the gate of the driving transistor T23; the source of the driving transistor T23 can be electrically connected to the power line PL1; the drain of the driving transistor T23 can be electrically connected to the anode of the light-emitting element 220B; the cathode of the light-emitting element 220B can be electrically connected to the power line PL2; and both ends of the storage capacitor C3 can be electrically connected to the drain of the select transistor T13 and the drain of the driving transistor T23, respectively.

In some embodiments, the driving circuit layer 230 may further include a plurality of pads PD, and the pads PD may be disposed on the surface of the driving circuit layer 230 for electrically connecting the signal line 120. For example, the pad PD may include pads P1-P7, and the pad P1 may be electrically connected to the scan line SL and the gate of the select transistor T1; the pad P3 may be electrically connected to the data line DL1 and the source of the select transistor T1; the pad P4 can electrically connected to the data line DL2 and the source of the select transistor T1 corresponding to the light-emitting element 220G; the pad P5 can be electrically connected to the data line DL3 and the source of the select transistor T1 corresponding to the light-emitting element 220B; the pad P6 can be electrically connected to the power line PL1 and the source of the driving transistor T2; and the pad P7 can be electrically connected to the power line PL2 and the cathode of the light-emitting element 220. In some embodiments, the pads P1 and P3 to P7 may be connected to the signal line 120 by SMT (Surface Mount Technology), but the disclosure is not limited thereto.

In addition, the driving circuit layer 230 may further include a transfer line WL1, and the transfer line WL1 can be electrically connected to the pad P1 and the pad P2 in various light-emitting units 200, that is, the transfer line WL1 can extend along the first direction D1, and the extending direction of the transfer line WL1 is different from the extending direction of the scan line SL. In some embodiments, the circuit board 100 may further include a plurality of auxiliary lines AW, and the auxiliary lines AW may extend along the first direction D1, that is, the extending direction of the auxiliary line AW is different from the extending direction of the scan line SL, and each auxiliary line AW can be electrically connected to the pads P1 and P2 of two adjacent light-emitting units 200 in the same row arranged along the first direction D1. In this way, the scan line SL of various circuit groups LS can be connected to the pad P1 of one of the light-emitting units 200 in different rows along the second direction D2, and then be electrically connected to the select transistor T1 of various light-emitting units 200 in the same row through the transfer line WL1 and the auxiliary line AW.

Referring to FIG. 1A, in some embodiments, the display device 10 may further include a driver chip IC. The driver chip IC may be disposed on one side of the base board 210 opposite to the light-emitting element 220, and the driver chip IC may be electrically connected to the signal line 120 through the circuit board PB of the light-emitting unit 200, the pad P8 of the circuit board 100, and the wire SW electrically connected to the circuit board PB and the pad P8. In this way, the wire SW does not need to be bent around the lateral side of the substrate 110, so the wire SW is less susceptible to damage by external forces. In addition, in some embodiments, the driver chip IC may be disposed on the substrate 110. Moreover, in some embodiments, the light-emitting unit 200 may further include a trace arranged on one side of the base board 210 opposite to the light-emitting element 220, that is, the surface of the base board 210 on which the circuit board PB is arranged may further be provided with a trace, and the wire SW can also be electrically connected to the trace and the signal line 120. In some embodiments, the light-emitting surface of the light-emitting element 220 may face the base board 210, and the base board 210 and/or the driving circuit layer 230 may have an opening corresponding to the light-emitting element 220 to facilitate the light-emitting element 220 to emit light.

Hereinafter, other embodiments or implementation of the disclosure will be described with reference to FIG. 2 to FIG. 4B; the same or similar reference numbers as used in the embodiments of FIG. 1A to FIG. 1C are used to denote the same or similar elements, and the description of the same technical content is omitted. Regarding the description of the omitted parts, reference may be made to the embodiments in FIG. 1A to FIG. 1C, which will not be repeated in the following description.

Figure 2:
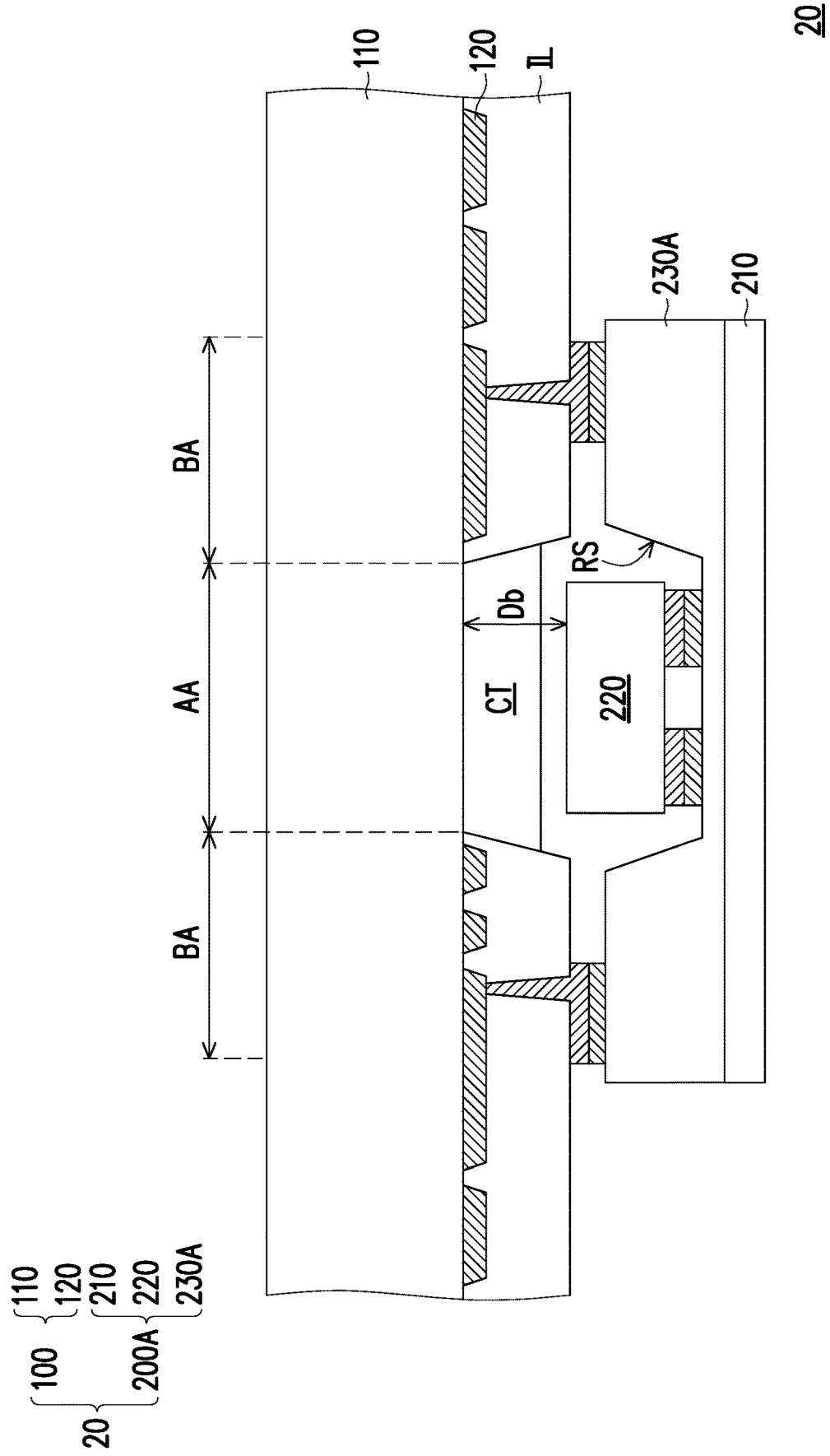
FIG. 2 is a schematic cross-sectional view of a display device 20 according to an embodiment of the disclosure.

FIG. 2 is a schematic cross-sectional view of a display device 20 according to an embodiment of the disclosure. Referring to FIG. 2, the display device 20 includes: a circuit board 100 and a plurality of light-emitting units 200A. The circuit board 100 includes a substrate 110 and a signal line 120 disposed on the substrate 110. The light-emitting units 200A are arranged in an array on the circuit board 100, and the orthographic projection region of the light-emitting unit 200A on the substrate 110 may include an opening region AA and a trace region BA. The light-emitting unit 200A includes a base board 210, a light-emitting element 220, and a driving circuit layer 230A. The light-emitting element 220 is located between the base board 210 and the substrate 110. The driving circuit layer 230A is located between the light-emitting element 220 and the base board 210 and is electrically connected to the light-emitting element 220 and the signal line 120. In addition, the display device 20 may also include an insulating layer IL covering the signal line 120 as needed.

Compared with the display device 10 shown in FIG. 1A to FIG. 1C, the structure of the display device 20 shown in FIG. 2 is different in that: the light-emitting unit 200A includes a light-emitting element 220, the driving circuit layer 230A has a recess RS, and the light-emitting element 220 is located in the recess RS. Moreover, the orthographic projection of the recess RS on the substrate 110 may overlap the opening region AA. In this way, the distance Db between the light-emitting element 220 and the substrate 110 of the display device 20 may be greater than the distance Da between the light-emitting element 220 and the substrate 110 in the display device 10 as shown in FIG. 1A. Therefore, in the display device 20, other components may be provided in the space between the light-emitting element 220 and the substrate 110.

For example, in this embodiment, the display device 20 may further include a color conversion layer CT, and the color conversion layer CT may include a wavelength conversion material such as phosphors or quantum dots with similar properties. The color conversion layer CT may be disposed in the space between the substrate 110 and the light-emitting element 220, and may cover the entire opening region AA. Since the light-emitting surface of the light-emitting element 220 can face the substrate 110, the light emitted by the light-emitting element 220 can be converted into light of different colors through the color conversion layer CT, so that the display device 20 can achieve a full-color display effect.

In this embodiment, the color conversion layer CT corresponding to each light-emitting unit 200A may have red, green, or blue, and three adjacent light-emitting units 200A may have red, green, and blue color conversion layers CT, respectively. In this way, each light-emitting unit 200A can constitute a sub-pixel of the display device 20, and the three adjacent light-emitting units 200A with red, green, and blue color conversion layers CT can constitute one pixel of the display device 20, but the disclosure is not limited thereto. In some embodiments, when the light-emitting element 220 emits blue light, the color conversion layer CT corresponding to the light-emitting unit 200A may have red color or green color, and part of the light-emitting element 220 may not be provided with the color conversion layer CT.

In some embodiments, the light-emitting unit 200A may include a plurality of light-emitting elements 220 with the same light color, and the color conversion layer CT may include, for example, a red region, a green region and a blue region spaced apart by a black matrix, and the red region, green region, and blue region of the color conversion layer CT may correspond to different light-emitting elements 220 respectively. In this way, a single light-emitting unit 200A can also constitute one pixel of the display device 20.

Figure 3A:
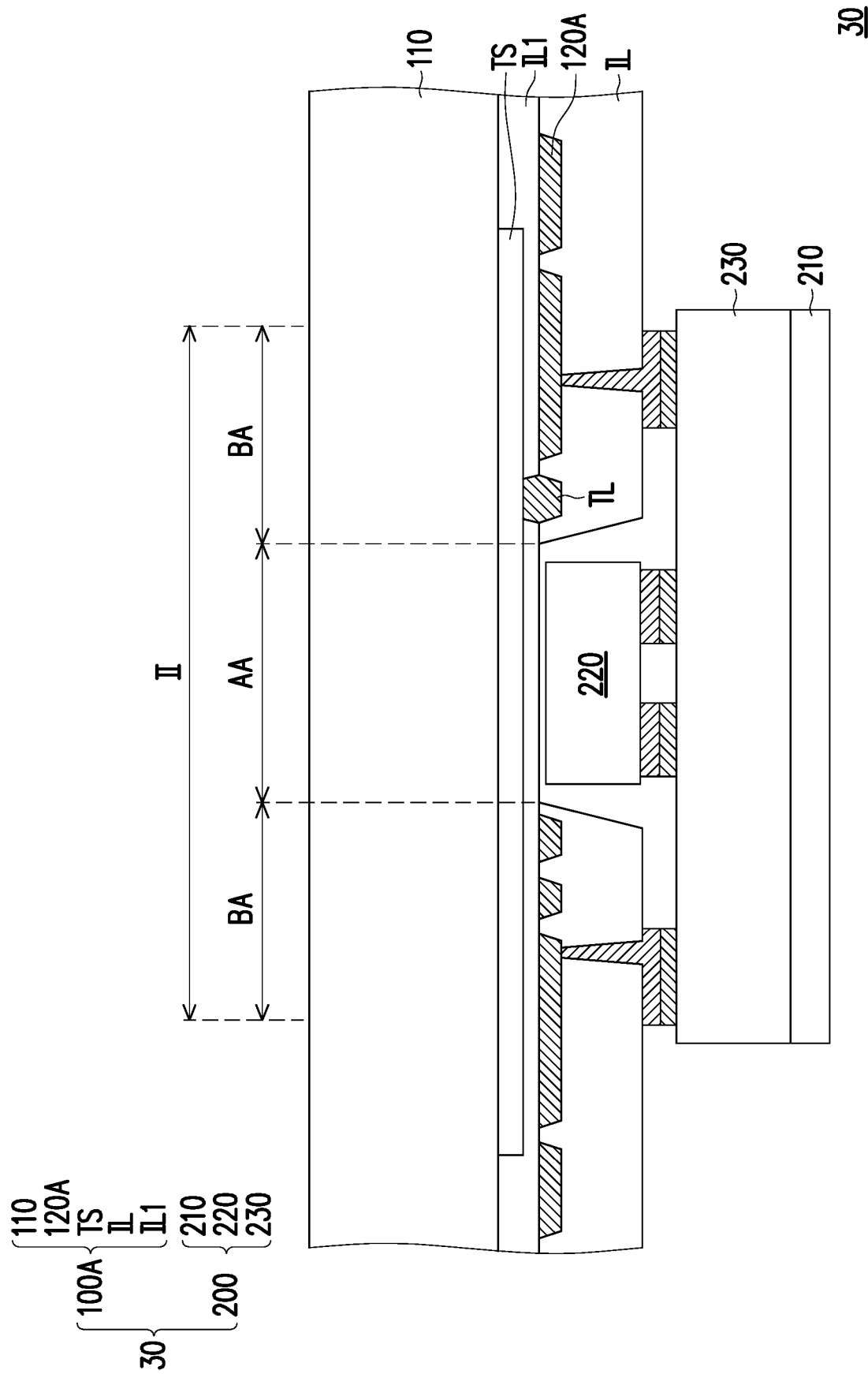
FIG. 3A is a schematic cross-sectional view of a display device 30 according to an embodiment of the disclosure.
Figure 3B:
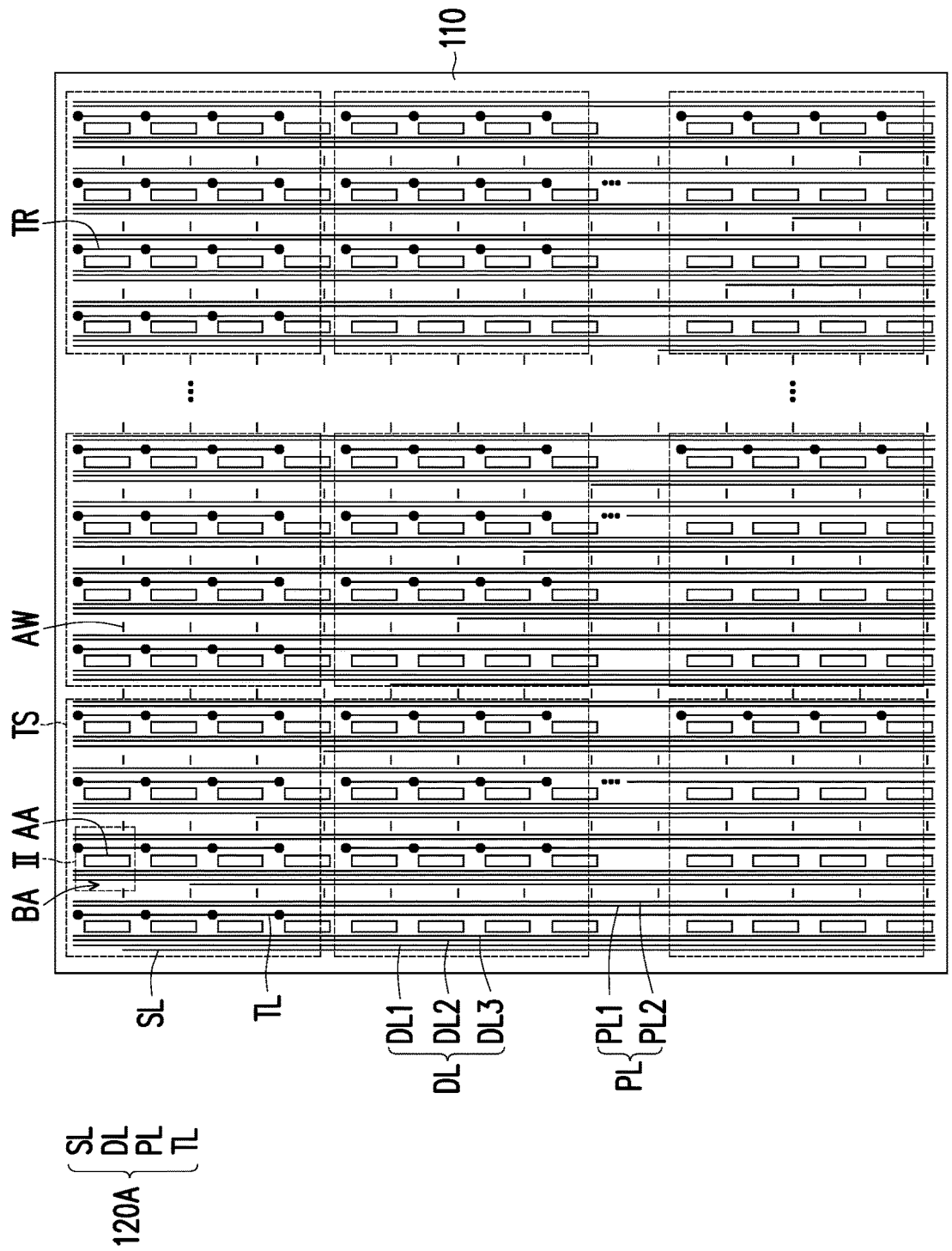
FIG. 3B is a schematic bottom view of a circuit board 100A of the display device 30 of FIG. 3A.

FIG. 3A is a schematic cross-sectional view of a display device 30 according to an embodiment of the disclosure. FIG. 3B is a schematic bottom view of the circuit board 100A of the display device 30 in FIG. 3A. Referring to FIG. 3A and FIG. 3B both, the display device 30 includes: a circuit board 100A and a plurality of light-emitting units 200. The circuit board 100A includes a substrate 110, a plurality of signal lines 120A, a plurality of auxiliary lines AW, and an insulating layer IL. The light-emitting unit 200 is located on the circuit board 100 and includes a base board 210, a plurality of light-emitting elements 220 and a driving circuit layer 230. The light-emitting element 220 is located between the base board 210 and the substrate 110. The driving circuit layer 230 is located between the light-emitting element 220 and the base board 210 and is electrically connected to the light-emitting element 220 and the signal line 120.

Compared with the display device 10 shown in FIG. 1A to FIG. 1C, the structure of the display device 30 shown in FIG. 3A to FIG. 3B is different in that: the circuit board 100A of the display device 30 further includes a touch sensing layer TS, and the plurality of signal lines 120A further include a touch transmission line TL, and the touch transmission line TL is electrically connected to the touch sensing layer TS.

For example, in this embodiment, the touch sensing layer TS may be located between the substrate 110 and the signal line 120A, and an insulating layer IL1 may be provided between the touch sensing layer TS and the signal line 120A to avoid unnecessary electrical connections. Meanwhile, the touch transmission line TL may be electrically connected to the touch sensing layer TS through the through holes in the insulating layer ILL respectively. The region II may be an orthographic projection region of the light-emitting unit 200 on the substrate 110, and the region II may include an opening region AA and a trace region BA, and the opening region AA may overlap the touch sensing layer TS and the light-emitting element 220. The touch sensing layer TS may overlap multiple regions II. For example, in this embodiment, the touch sensing layer TS may overlap 4×4 regions II, that is, the orthographic projection region of the touch sensing layer TS on the substrate 110 may be approximated to the orthographic projection region of 16 light-emitting units 200 on the substrate 110, but the disclosure is not limited thereto. In some embodiments, the orthographic projection region of the touch sensing layer TS on the substrate 110 may overlap the orthographic projection region of 2×2, 2×3, 3×3, 3×4, 5×5 or more light-emitting units 200 on the substrate 110, depending on the touch sensing sensitivity required for the display device 30.

In this embodiment, the signal lines 120A may include scan lines SL, data lines DL, touch transmission lines TL, and power lines PL that are located in the same layer, sequentially arranged along the first direction D1 and extend in parallel along the second direction D2. The data line DL includes data lines DL1, DL2 and DL3, and the power line PL includes power lines PL1 and PL2. The scan line SL, the data line DL, the touch transmission line TL, and the power line PL are located in the trace region BA, and the trace region BA surrounds the opening region AA. For example, in this embodiment, the opening region AA may be located between the data line DL3 and the touch transmission line TL. In some embodiments, the signal line 120A may further include a plurality of wires TR, and each wire TR may be electrically connected to a corresponding touch sensing layer TS through a plurality of connection points, so as to reduce the transmission impedance of the touch sensing layer TS. Similarly, each touch transmission line TL can also be electrically connected to a corresponding touch sensing layer TS through a plurality of connection points. By disposing the touch sensing layer TS and the touch transmission line TL on the circuit board 100A, the touch function of the display device 30 can be provided without changing the circuit design of the light-emitting unit 200.

Figure 4A:
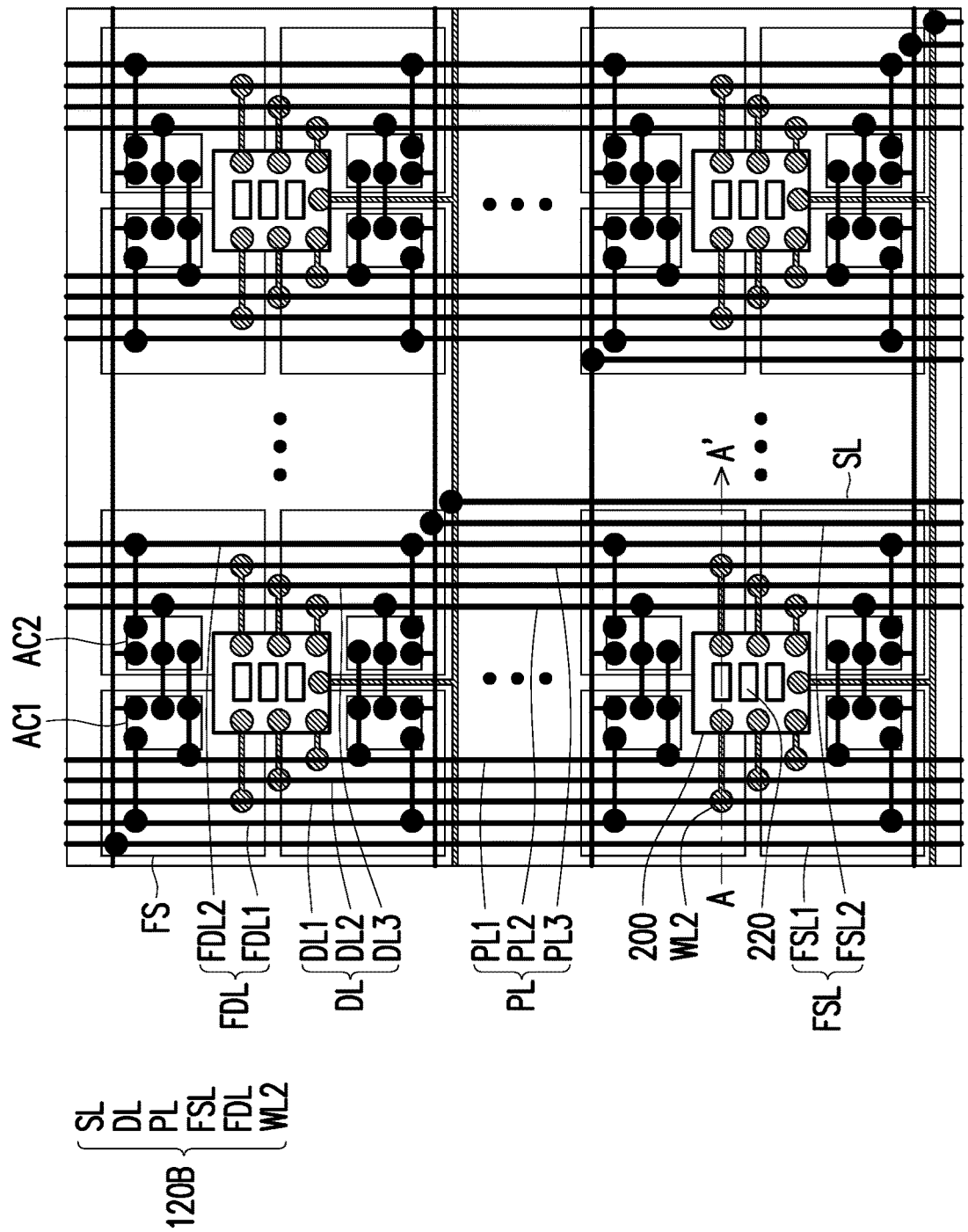
FIG. 4A is a schematic top view of a display device 40 according to an embodiment of the disclosure.
Figure 4B:
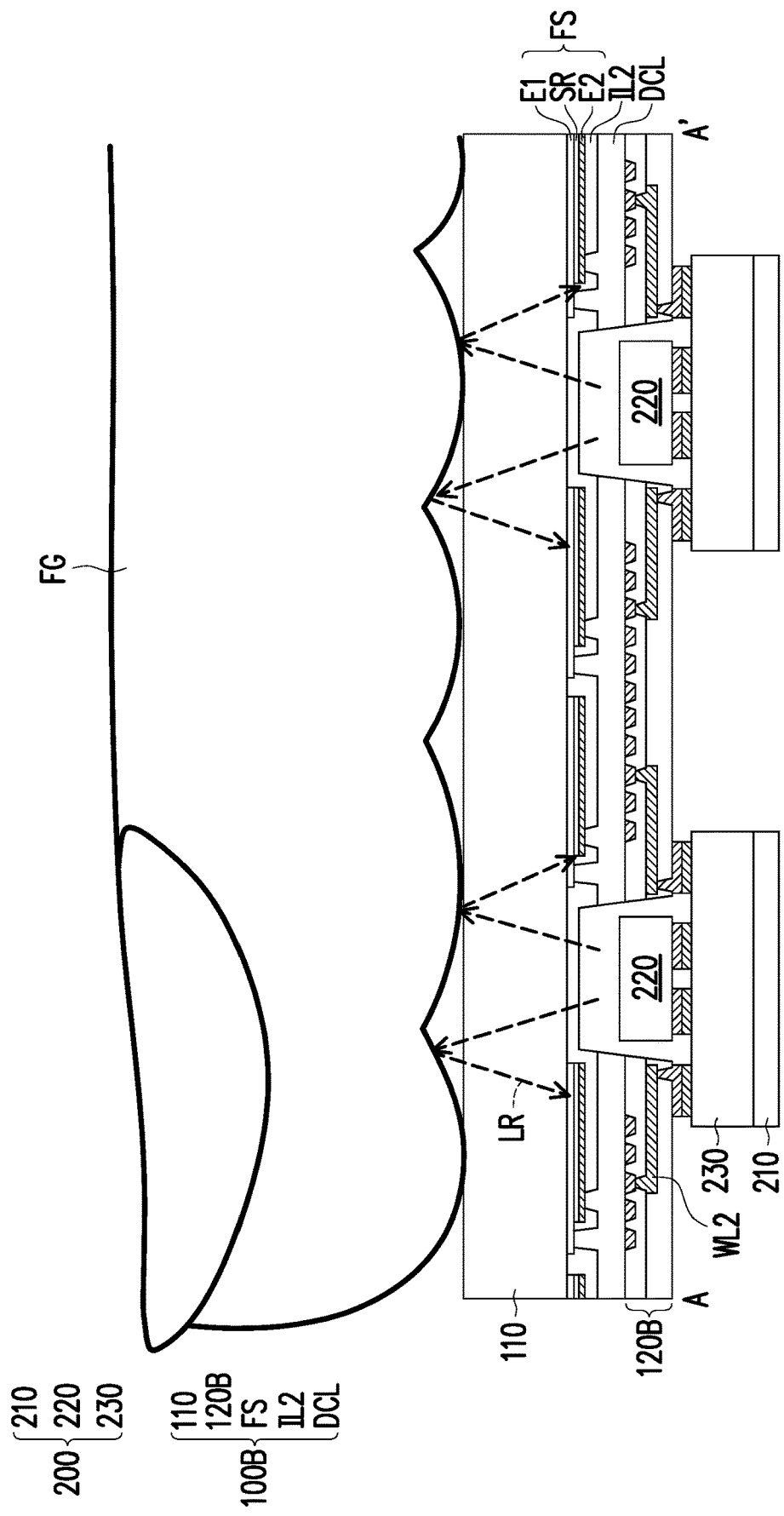
FIG. 4B is a schematic cross-sectional view taken along the section line A-A' of FIG. 4A.

FIG. 4A is a schematic top view of a display device 40 according to an embodiment of the disclosure. FIG. 4B is a schematic cross-sectional view taken along the section line A-A' of FIG. 4A. Referring to FIG. 4A and FIG. 4B both, the display device 40 includes: a circuit board 100B and a plurality of light-emitting units 200. The circuit board 100B includes a substrate 110 and a plurality of signal lines 120B on the substrate 110. The light-emitting unit 200 is located on the circuit board 100, and the light-emitting unit 200 includes a base board 210, a plurality of light-emitting elements 220 and a driving circuit layer 230. The light-emitting element 220 is located between the base board 210 and the substrate 110. The driving circuit layer 230 is located between the light-emitting element 220 and the base board 210, and is electrically connected to the light-emitting element 220 and the signal line 120B.

Compared with the display device 10 shown in FIG. 1A to FIG. 1C, the structure of the display device 40 shown in FIG. 4A to FIG. 4B is different in that: the circuit board 100B of the display device 40 further includes a photosensitive element FS and its driving circuit layer DCL; the plurality of signal lines 120B belong to different layers, and the plurality of signal lines 120B further include a sensing scan line FSL and a sensing data line FDL.

For example, in this embodiment, the signal line 120B may include a scan line SL, a data line DL, a power line PL, a sensing scan line FSL, and a sensing data line FDL, and the data line DL may include data lines DL1, DL2 and DL3, the power line PL may include power lines PL1, PL2, and PL3, the sensing scan line FSL may include sensing scan lines FSL1 and FSL2, and the sensing data line FDL may include sensing data lines FDL1 and FDL2. In some embodiments, the signal line 120B may further include an auxiliary line WL2, and the scan line SL, the data line DL, the power line PL, the sensing scan line FSL, and the sensing data line FDL may belong to the same layer, and the auxiliary line WL2 may belong to another layer. In this way, the signal lines 120B belonging to different layers can extend in different directions. For example, the extending direction of the auxiliary line WL2 may intersect the extending direction of the scan line SL, the data line DL or the power line PL, and the auxiliary line WL2 may be electrically connected to the scan line SL, the data line DL or the power line PL, and the driving circuit layer 230.

In this embodiment, the photosensitive element FS may be located between the substrate 110 and the signal line 120B, but the disclosure is not limited thereto. The photosensitive element FS may include a first electrode E1, a second electrode E2, and a sensing layer SR sandwiched between the first electrode E1 and the second electrode E2. In this embodiment, the first electrode E1 may be a transparent electrode, and the second electrode E2 may be an opaque electrode. The first electrode E1 is generally a nitride of a metal material, an oxide of a metal material, an oxynitride of a metal material or other suitable materials, or a stacked layer of the above conductive materials, such as indium-tin-oxide, indium-zinc-oxide, aluminum-tin-oxide, aluminum-zinc-oxide, indium-gallium-zinc-oxide or other suitable oxides or a stack of at least two of the above, but the disclosure is not limited thereto. The second electrode E2 generally adopts a metal material, such as molybdenum, aluminum, titanium, copper, gold, silver, or other conductive materials, or a stack of any two or more of the foregoing materials, but the disclosure is not limited thereto. The material of the sensing layer SR is, for example, silicon-rich oxide (SRO) or other suitable materials.

In this embodiment, the driving circuit layer DCL of the circuit board 100B can be electrically connected to the first electrode E1 and the second electrode E2 of the photosensitive element FS. The driving circuit layer DCL may include, for example, active elements AC1 and AC2. The active elements AC1 and AC2 may be electrically connected to the first electrode E1 or the second electrode E2, respectively, so as to control the operation of the photosensitive element FS. In addition, the active elements AC1 and AC2 can also be electrically connected to the sensing scan lines FSL1 and FSL2, respectively, and the active elements AC1 and AC2 can also be electrically connected to the sensing data lines FDL1 and FDL2, respectively. In this way, the active elements AC1 and AC2 can respectively receive signals from the sensing scan lines FSL1 and FSL2 and the sensing data lines FDL1 and FDL2 to control the photosensitive element FS.

In this embodiment, the active elements AC1 and AC2 may be located outside the orthographic projection region of the light-emitting unit 200 on the substrate 110, but the disclosure is not limited thereto. In some embodiments, the active elements AC1 and AC2 may be located in the orthographic projection region of the light-emitting unit 200 on the substrate 110. For example, the active elements AC1 and AC2 may be located in the trace region BA of the foregoing embodiment. In some embodiments, driving elements such as a gate driver on array or other test circuits may be provided outside the orthographic projection region of the light-emitting unit 200 on the substrate 110.

The circuit board 100B may further include an insulating layer IL2 located between the second electrode E2 and the driving circuit layer DCL to avoid unnecessary electrical connections. In some embodiments, the photosensitive element FS may be used as a fingerprint sensing element. For example, when the finger FG touches the display device 40, the photosensitive element FS can sense the light LR reflected by the finger FG after being emitted by the light-emitting element 220, and generate an image corresponding to the fingerprint of the finger FG, and then perform fingerprint recognition on the finger FG. By disposing the photosensitive element FS on the circuit board 100B, the fingerprint sensing function of the display device 40 can be provided without changing the circuit design of the light-emitting unit 200.

In summary, the disclosure separately arranges the signal line and the driving circuit layer of the light-emitting element on the circuit board and light-emitting unit opposite to each other, such that there is no need to use the trace that passes through the lateral side of the substrate to connect the driving circuit layer of the light-emitting element and the driver chip, thereby improving the yield rate. In addition, the light-emitting element and its driver circuit are integrated into the light-emitting unit, so that the same type of photomasks can be used for manufacturing the light-emitting units, thereby reducing production costs.

Although the present disclosure has been disclosed in the above embodiments, it is not intended to limit the present disclosure. Anyone with ordinary knowledge in the relevant technical field can make some changes and modifications without departing from the spirit and scope of the present disclosure. Therefore, the scope to be protected by the present disclosure shall be subject to the scope of the attached claims.

What is claimed is:

1. A display device, comprising:
   a circuit board, comprising:
   a substrate; and
   a plurality of signal lines disposed on the substrate;
   an insulating layer formed on the substrate and the signal lines, having a plurality of through holes each provided with a through hole conductive structure penetrating thereto so that the through hole conductive structures are electrically connected with the signal lines respectively; and
   a plurality of light-emitting units separated from each other and disposed on the circuit board, wherein each of the light-emitting units comprises:
   a base board;
   at least one light-emitting element located between the base board and the substrate; and
   a driving circuit layer located between the light-emitting element and the base board, and electrically connected to the light-emitting element and the corresponding ones of the signal lines, wherein the driving circuit layer is electrically connected to the corresponding ones of the signal lines by a plurality of pads formed on the driving circuit layer and corresponding ones of the through hole conductive structures.

2. The display device according to claim 1, wherein an orthographic projection region of each of the light-emitting units on the substrate comprises an opening region and a trace region, and the corresponding ones of the signal lines is located in the trace region.

3. The display device according to claim 2, wherein an orthographic projection of the light-emitting element on the substrate is located in the opening region.

4. The display device according to claim 2, wherein the circuit board further comprises an active element, and the active element is located outside the orthographic projection region.

5. The display device according to claim 1, wherein the signal lines are parallel to each other and belong to the same layer.

6. The display device according to claim 1, wherein the driving circuit layer comprises a transistor, and the transistor is electrically connected to the corresponding ones of the signal lines.

7. The display device according to claim 6, wherein the signal lines comprise scan lines and data lines.

8. The display device according to claim 7, wherein the circuit board further comprises an auxiliary line, and an extending direction of the auxiliary line is different from an extending direction of the scan lines.

9. The display device according to claim 1, wherein a light-emitting surface of the light-emitting element faces the substrate or the base board.

10. The display device according to claim 1, wherein the signal lines comprise a power line, and the power line is electrically connected to the light-emitting element.

11. The display device according to claim 1, wherein the driving circuit layer has a recess, and the light-emitting element is located in the recess.

12. The display device according to claim 11, further comprising a color conversion layer, and the color conversion layer is located between the substrate and the light-emitting element.

13. The display device according to claim 1, wherein the circuit board further comprises a touch sensing layer, and the touch sensing layer is located between the substrate and the signal lines.

14. The display device according to claim 13, wherein the signal lines further comprise a touch transmission line, and the touch transmission line is electrically connected to the touch sensing layer.

15. The display device according to claim 1, wherein the circuit board further comprises a photosensitive element, and the photosensitive element is located between the substrate and the signal lines.

16. The display device according to claim 1, wherein the signal lines belong to different layers.

17. The display device according to claim 1, further comprising a driver chip located on one side of the base board opposite to the light-emitting element, and the driver chip is electrically connected to the signal lines.

* * * * *